United States Patent
Draxelmayr

(10) Patent No.: US 9,800,252 B2
(45) Date of Patent: Oct. 24, 2017

(54) METHODS AND DEVICES FOR STORING PARAMETERS

(71) Applicant: Infineon Technologies AG, Neubiberg (DE)

(72) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/798,442

(22) Filed: Jul. 13, 2015

(65) Prior Publication Data

US 2017/0117912 A1    Apr. 27, 2017

(30) Foreign Application Priority Data

Jul. 11, 2014   (DE) .................. 10 2014 109 746

(51) Int. Cl.
  *H03M 1/06*   (2006.01)
  *G11C 7/16*   (2006.01)
  *H03M 1/10*   (2006.01)

(52) U.S. Cl.
  CPC ............. *H03M 1/0617* (2013.01); *G11C 7/16* (2013.01); *H03M 1/1009* (2013.01)

(58) Field of Classification Search
  CPC .. H03M 1/0617; H03M 1/1009; H03M 1/166; H03M 1/12; G11C 7/16
  USPC ......................................... 341/118, 155, 144
  See application file for complete search history.

(56) References Cited

U.S. PATENT DOCUMENTS

| 7,340,223 | B1* | 3/2008 | Wright ............... | H01Q 1/243 375/297 |
| 7,561,636 | B2* | 7/2009 | Song ................ | H03F 1/3247 375/297 |
| 7,592,939 | B1* | 9/2009 | Cruz-Albrecht ........ | H03M 3/02 341/144 |
| 2003/0052803 | A1 | 3/2003 | Engl et al. | |
| 2011/0227770 | A1 | 9/2011 | Kaper et al. | |

FOREIGN PATENT DOCUMENTS

DE    10007408 A1    9/2001
EP     1775838 A1    4/2007

OTHER PUBLICATIONS

Office Action, in the German language, from counterpart German Application No. 102014109746.7, dated Jan. 28, 2016, 7 pp.

* cited by examiner

*Primary Examiner* — Jean B Jeanglaude
(74) *Attorney, Agent, or Firm* — Shumaker & Sieffert, P.A.

(57) ABSTRACT

Methods and devices are provided in which a first parameter partial value (p1) is stored in a first memory (12) and a second parameter partial value (p2) is stored in a second memory (13). A parameter value (p) of a parameter can then be obtained by combining the first parameter partial value (p1) with the second parameter partial value (p2).

20 Claims, 3 Drawing Sheets

METHODS AND DEVICES FOR STORING PARAMETERS

TECHNICAL FIELD

The present application relates to methods and devices for storing parameters.

BACKGROUND

Many blocks or circuit parts of electronic circuits, for example analog blocks or circuits, require parameters set appropriately during operation, in order to work correctly. By way of example, analog-to-digital converters (A/D converters) or digital-to-analog converters (D/A converters) may require parameters for compensating for an offset, for setting a desired gain or for achieving a desired linearity. Such parameters can be obtained by means of a calibration, for example. Afterward, said parameters can be stored in various types of memories, in particular nonvolatile memories such as flash memories, fusible memories, electrically programmable read-only memories (EPROMs) or other nonvolatile memories. Sometimes said parameters can also be transferred from nonvolatile memories into volatile memories such as random access memories (RAMS) or registers, in order to facilitate operation.

In particular, in some applications such parameters are used for the digital correction, for example completely digital correction, of components. In particular, analog circuits may have certain tolerances, for example, which can then be corrected by digital calculations and techniques, for example. In the case of such a digital correction, the analog components are accepted for example in the manner as they are produced, but information in the circuit is modified in a digital part, for example in order to correct errors. By contrast, an analog correction would typically comprise modifying analog components, which is complex.

By way of example, an analog-to-digital converter having an analog implementation having high tolerances, for example, would initially supply incorrect digital output codes, but a digital correction could be used to modify said codes, such that the overall system comprising analog-to-digital converter and digital correction works correctly. By way of example, a look-up table can be used which translates the "incorrect" codes initially output by the analog-to-digital converter into the "correct" codes. Such a look-up table, in which a corrected code is assigned for example to each output code of the analog-to-digital converter, then constitutes an example of stored parameters. Similar techniques can be used for other components, for example digital-to-analog converters or digitally controlled oscillators. In the case of other devices, parameters can be used differently, for example in the context of calculations, in order to correct results or else in order to set and/or adapt the devices.

Such parameters are conventionally stored as digital values. Certain error events can corrupt or alter such stored data, however, for example α-particles that impinge on a memory cell, or else power failures or power interruptions. If such an error is not detected, the behavior of the respective device can change significantly, since values then altered, for example, after an event, for example more or less random values, are stored as parameters. This can lead to malfunctions. Even if the error is detected, this often leads at least to a brief failure of the device until, for example, a calibration has been repeated or the parameters have been corrected in some other way.

Therefore, it is an object of the present application to provide possibilities for reducing a susceptibility to errors with regard to devices that use stored parameters, or at least to reduce errors that may arise as a result of stored parameters being corrupted.

BRIEF SUMMARY

A device according to claim 1 and a method according to Claim 14 are provided. The dependent claims define further exemplary embodiments.

DETAILED DESCRIPTION

Various exemplary embodiments are explained in detail below. It should be noted that these exemplary embodiments merely serve for illustration and should not be interpreted as restrictive. Even if exemplary embodiments which may comprise a multiplicity of elements or components are described, this should not be interpreted to the effect that all these elements or components are essential, since in other exemplary embodiments some of said elements or components may be omitted or may be replaced by alternative elements or components. In other exemplary embodiments, additional elements or components may be provided.

Features, elements or components of different exemplary embodiments can be combined with one another, unless indicated otherwise. Couplings or connections between elements or components may be direct connections or couplings without intervening elements or indirect connections or couplings with one or more intervening elements, as long as the basic function of the connection or coupling remains substantially the same, for example transmitting certain information or a certain signal.

In some exemplary embodiments, a first parameter partial value of a parameter is stored in a first memory and a second parameter partial value of the parameter is stored in a second memory, which differs from the first memory, in particular is physically separate from the latter. In this regard, the first memory may be of a different type, in particular a more secure type, than the second memory. If the parameter is required, the first parameter partial value can then be read out from the first memory, the second parameter partial value can be read out from the second memory, and a parameter partial value of the parameter can then be obtained by combining the first parameter partial value with the second parameter partial value (for example by addition or subtraction).

In other exemplary embodiments, a first parameter value can be stored in a first memory and a second parameter value can be stored in a second memory. A main network of a converter device can be corrected or set on the basis of the first parameter value, and a correction network of the converter device can be corrected or set on the basis of the second parameter value.

By way of example, a general and/or ideal value of the parameter for a specific type of device can be stored in the first memory, and a deviation and/or correction for the respectively individual device can be stored in the second memory. If the content of the second memory is corrupted for example by an event, such as cosmic radiation, then in some exemplary embodiments operation can be continued with lower accuracy, if appropriate, since the parameter partial value of the first memory is still available. Other techniques may be used in other exemplary embodiments.

Figure 1:
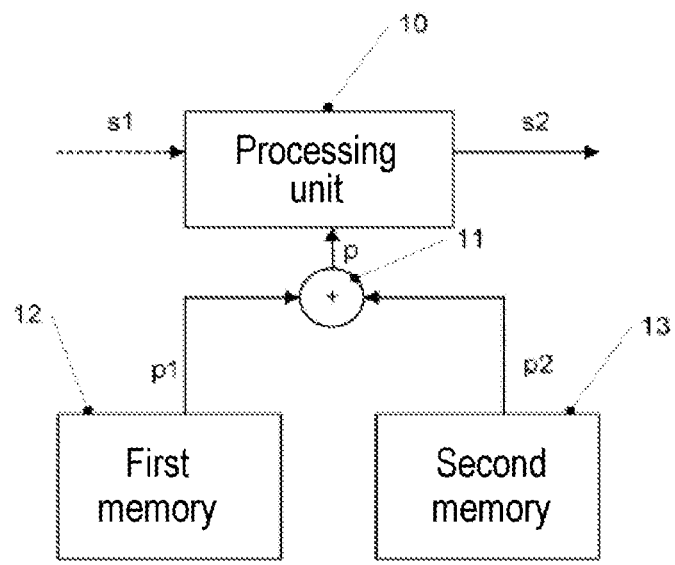
FIG. 1 is a block diagram of a device for storing parameters in accordance with one exemplary embodiment.

FIG. 1 schematically illustrates a device in accordance with one exemplary embodiment. The device in FIG. 1 comprises a first memory 12 and a second memory 13. In this case, the first memory 12 and the second memory 13 are different memories, for example physically separate memories and/or memories of different types. By way of example, the first memory 12 can comprise a read-only memory (ROM) or a hardwired logic. The second memory 13 can comprise for example an EPROM, a flash memory, a random access memory (RAM) and/or a register. A RAM or register can be occupied e.g. by calibration or by data from a different memory. The first memory 12 can be constructed and/or arranged in such a way that it is less susceptible to errors than the second memory 13, e.g. less susceptible to unintentional changes in the memory content, for example due to α-rays or other types of radiation.

In the exemplary embodiment in FIG. 1 the first memory serves for storing a first parameter partial value p1 of a parameter. The second memory 13 serves for storing a second parameter partial value of the parameter. Even if only one parameter is mentioned here for illustration purposes, first and second parameter partial values of a plurality of different parameters can also be stored in the first memory 12 and the second memory 13.

If, for example, a processing unit 10 then requires the parameter, the first parameter partial value p1 is read out from the first memory 12 and the second parameter partial value p2 is read out from the second memory 13. In order then to obtain a parameter partial value p of the parameter, the first parameter partial value p1 is combined with the second parameter partial value p2, for example added in an adder 11 or subtracted. The parameter value p can then be used in the processing unit 10 to process an input signal s1 using the parameter value p and for example to output a processed signal s2. In other exemplary embodiments, the processing unit 10 can also output only a signal s2 obtained with the use of the parameter p.

In this case, the processing unit 10 can comprise for example an analog-to-digital converter (A/D converter) arrangement or a digital-to-analog converter (D/A converter) arrangement, an oscillator or else for example a sensor. The parameter having the parameter value p can serve for example for calibration and/or linearization of the processing unit 10, but is not restricted thereto. In some exemplary embodiments, a plurality of parameters having different parameter values p can be stored for example in the form of a look-up table in the first memory 12 and the second memory 13, wherein corresponding output signals s2 are assigned for example to possible input values s1 by means of the look-up table. Other uses of parameters, for example multiplicative parameters or parameters that are used in some other way for a calculation in the processing unit 10, can also be stored in this way.

In some exemplary embodiments, the parameter partial value p1 can correspond to an average value, a basic value and/or an ideal value of the parameter, and the second parameter partial value p2 can specify a deviation from said average value, basic value and/or ideal value. By way of example, in such a case, the first parameter partial value p1 can be a value which was determined generally for a specific design or a specific type of processing unit 10. The second parameter partial value p2 can then be a correction value for the respectively individual processing unit 10.

In such an exemplary embodiment, for example, if the content of the second memory 13 and thus the second parameter partial value p2 is corrupted by an event, for example by an α-particle, the processing unit can continue to work on the basis of the first parameter partial value p1. As a result, although outputs of the processing unit 10 (for example the signal s2) may become less accurate in some implementations, they may nevertheless be usable to such an extent that for example a shutdown or recalibration can initially be avoided. In some exemplary embodiments, the corrections stored in the second memory 13, for example the second parameter partial value p2, are relatively small compared with the first parameter partial value p1, such that an alteration of the second parameter partial value p2 can result in only a comparatively small corruption of the parameter value p.

This is explained in even greater detail further below on the basis of an example.

It should be noted that, in other exemplary embodiments, the parameter value p can also be divided into more than two parameter partial values and can correspondingly be stored in more than two separate memories.

Figure 2:
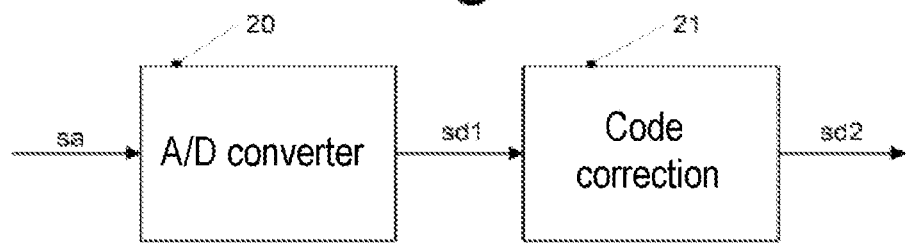
FIG. 2 shows a first application example for a device for storing parameters in accordance with exemplary embodiments.

FIG. 2 illustrates a first application example for a device such as the device shown in FIG. 1. FIG. 2 shows an A/D converter arrangement comprising an A/D converter 20 and a code correction circuit 21. The A/D converter 20 receives an analog signal sa and outputs a first digital signal sd1. The A/D converter 20 may be an arbitrary type of A/D converter, for example an SAR converter (Success Approximation Register), or a converter having a pipeline structure. The code correction circuit 21 corrects the first digital signal sd1 with the aid of one or more stored parameters to form a second digital signal sd2. The one or more parameters used for the code correction circuit can be stored, as discussed under FIG. 1, i.e. the parameter values of the one or more parameters can be divided into first parameter partial values and second parameter partial values and be stored in a first memory and in a second memory. Explanations and variants of this storage as explained with reference to FIG. 1 can also be applied in the application example in FIG. 2.

A concrete example of the use of a first memory and a second memory for storing parameter partial values for the application example in FIG. 2 is explained below. However, this serves only for illustration purposes, and it should be noted, in particular, that numerical values indicated serve merely as an example and may also be different depending on the implementation.

As an example it is assumed that the A/D converter 20 is an 8-bit SAR converter. In the case of an ideal 8-bit SAR converter, the most significant bit (MSB) of an indication of the converter has a value (bit weight) of 1000 0000, the next bit has a value of 0100 0000, followed by 0010 0000 down to 0000 0001 for the least significant bit (LSB). An output code (corresponding to the signal sd1 in FIG. 2) is determined by adding all bit weights of the bits that are determined by a search algorithm with successive approximation. The addition of the bit weights is simple in this case since e.g. adding all bit weights corresponding to an SAR code of, for example, 0110 1100 leads to an output code 0110 1100, i.e. exactly the same code.

In the case of a non-ideal 8-bit SAR converter, by way of example, the MSB could correspond to a value of 1000 0010 (2 LSBs greater than in the ideal case), the next bit could correspond to a value of 0011 1111 (1 LSB less than ideal), etc. In this case, too, the correct output code can be found by adding these values (bit weights). That means that in this case an SAR code of 1100 0000 would be corrected or translated by the code correction circuit 21 into 1000 0010+ 0011 1111=1100 0001 as output signal sd2.

The values for the individual bits of the SAR code then represent parameters, i.e. in the above example 1000 0010 for the MSB and 0011 1111 for the next bit, and so on. For the output, a corresponding bit weight is then assigned to each bit of the signal sd1 in FIG. 2 by means of these stored parameters, and these bit weights are added in order to obtain the signal sd2.

In exemplary embodiments of the invention, parameter values as explained with reference to FIG. 1 are stored as a plurality of parameter partial values, for example two thereof, in a plurality of different memories, for example two thereof.

In the above example, the bit weights can then be stored as a first parameter partial value, which corresponds to an ideal value, for example, and a second parameter partial value, which corresponds to a correction value. For the numerical examples above, in one exemplary embodiment, the division into a first parameter partial value and a second parameter partial value can then be manifested as follows:

For the MSB: first parameter partial value 1000 0000; second parameter partial value 0000 0010, which corresponds to the ideal value plus a correction value of +2, next value bit (MSB−1): first parameter partial value 0100 0000; second parameter partial value 1111 1111, which corresponds to the ideal value plus a correction value of −1 in two's complement notation.

A corresponding procedure can be adopted for the other bits. Instead of two's complement notation, some other representation, for example with a sign bit, may also be used.

In the above example, both the ideal value and the correction value are stored as 8-bit value. In many applications, however, the correction values may be small, as in the above example (correction values of +2 and −1, respectively). In this case, the correction value can also be stored with fewer bits, for example 3 bits. The correction value for the MSB in the above example would then be stored e.g. as 010 and the correction value for the next-highest significant bit would then be stored e.g. in two's complement notation as 111. In such an exemplary embodiment, for example, the second memory 13 in FIG. 1 may have a smaller bit width than the first memory 12 in FIG. 1.

If, in such an exemplary embodiment in which correction values are stored as second parameter partial values with a smaller number of bits, the correction values are corrupted in the second memory by an event such as cosmic radiation or the like, the error that arises in the parameter cannot become greater than the maximum correction value (in the example of a 3-bit correction value in which negative values are stored in two's complement notation, that is to say for example in a range of −4 to +3 LSB). Consequently, a corresponding device such as the A/D converter device in FIG. 2 could continue to work at least with reduced accuracy, wherein the maximum error would be limited.

In this case, the bit width of 3 bits for the correction value should be understood merely as an example, and other bit widths can be used in other exemplary embodiments. In some exemplary embodiments, a corruption of the correction values may also be detected and, in the case of a detected error, only the ideal values stored in the first memory 12, for example, may be used.

Figure 3:
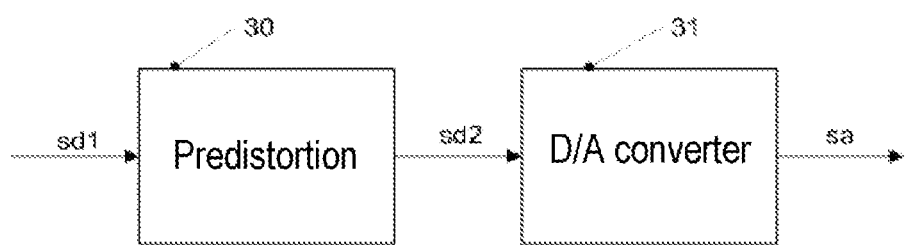
FIG. 3 shows a second application example for a device for storing parameters in accordance with exemplary embodiments.

The application of parameter storage with a plurality of parameter partial values is not limited to analog-to-digital converter devices as illustrated in FIG. 2. A further application example in the form of a digital-to-analog converter device is illustrated in FIG. 3. The digital-to-analog converter device in FIG. 3 comprises a digital-to-analog converter (D/A converter) 31, which converts a digital signal sd2 into an analog signal sa. In this case, the D/A converter 31 may have a non-ideal behavior. A non-ideal behavior may have the effect, for example, that the output signal sa for a value sd2 of 1000 0000 does not have exactly double the value as for an input signal sd2 of 0100 0000. In order to compensate for this, a predistortion circuit 30 is used in the exemplary embodiment in FIG. 3. A digital value sd1 to be converted is fed to the predistortion circuit 30. In a manner similar to the code correction circuit 21 in FIG. 2, the predistortion circuit 30 translates the value sd1 into a value sd2 by means of stored parameters. As a result, inaccuracies of the D/A converter 31 are at least partly compensated for, such that in the case of an ideal predistortion the analog output signal sa corresponds as exactly as possible to an analog version of the digital signal sd1. In this case, as discussed for the code correction circuit 21, the parameters for the predistortion circuit 30 can be stored in the form of a look-up table, wherein for example for each parameter a first parameter partial value can be stored in a first memory and a second parameter partial value can be stored in a second memory, as explained with reference to FIG. 1. In this case, the first parameter partial value can comprise for example a value for a D/A converter 31 of a specific type, and the second parameter partial value can comprise an individual correction value for the D/A converter respectively used, for example a correction obtained individually by calibration for each component. Other divisions are also possible. Variations and modifications discussed with reference to FIGS. 1 and 2 are also applicable to the example in FIG. 3.

Figure 4:
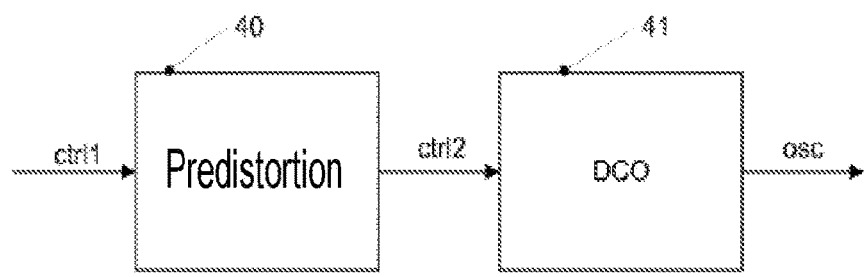
FIG. 4 shows a third application example of a device for storing parameters in accordance with exemplary embodiments.

A further application example is illustrated in FIG. 4. FIG. 4 shows an oscillator device comprising a digitally controlled oscillator (DCO) 41. The digitally controlled oscillator 41 receives a digital control signal ctrl2 and outputs one or more oscillator signals osc. In this case, the one or more oscillator signals osc have a frequency that is controllable by the control signal ctrl2.

Depending on the implementation of the digitally controlled oscillator 41, in this case a behavior of the frequency depending on the control signal ctrl2 may be nonlinear, for example, while a linear behavior is desired. By way of example, it may be desired that, in the case of an increase in the control signal by one LSB, a frequency of the at least one oscillator signal osc always increases by the same magnitude.

In order to generate such a linear behavior, a predistortion circuit 40 is used in the application example in FIG. 4, which predistortion circuit translates a control signal ctrl1 into the control signal ctrl2 in such a way that for example a dependence of a frequency of the at least one output signal osc on the control signal ctrl1 is linear. Techniques such as those already discussed above can be used in this case. In particular, the predistortion circuit 40 can comprise a lookup table having stored parameter values, wherein the parameter values are divided in a split fashion as first parameter partial value in a first memory such as the first memory 12 in FIG. 1 and a second parameter partial value stored in a second memory such as the second memory 13 in FIG. 1. In this case, the first parameter partial value may in turn correspond to a general value used for a specific type of digitally controlled oscillator (DCO), and the second parameter partial values can be correction values for individual components. Other divisions are also possible. Here, too, operation can be maintained with a certain accuracy, if, for example, the second parameter partial values are corrupted.

FIGS. 2 and 4 serve merely for illustrating the fact that the techniques discussed with reference to FIG. 1 can be used in many different application environments. However, the use of the techniques discussed with reference to FIG. 1 is not restricted to the application examples in FIGS. 2 to 4, but rather can be used generally if parameters are required for operating a device, e.g. also in sensor circuits.

Figure 5:
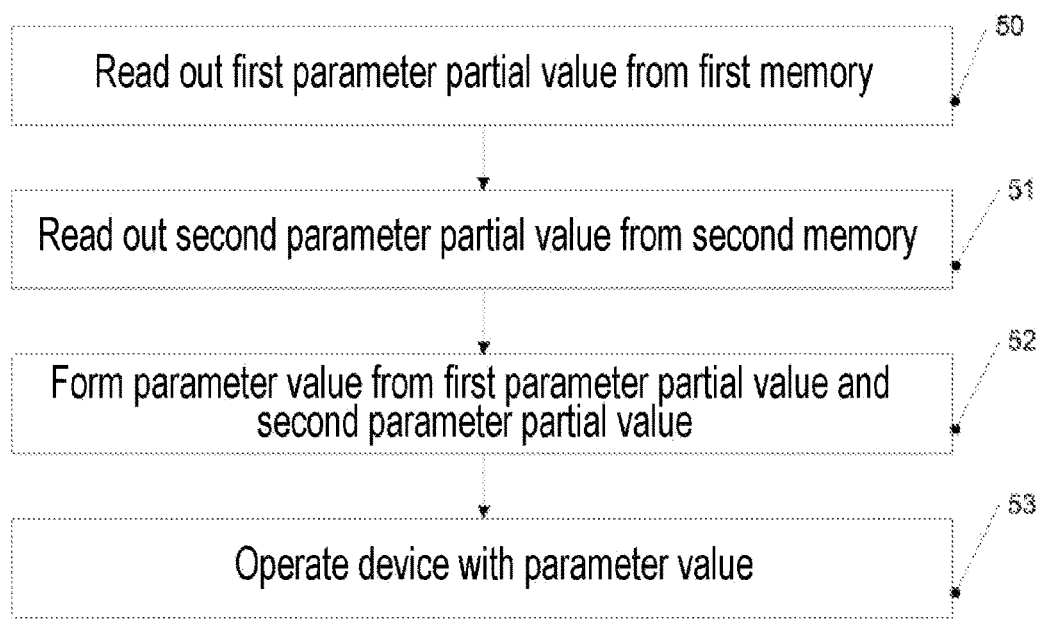
FIG. 5 shows a flow diagram for illustrating a method in accordance with one exemplary embodiment.

FIG. 5 illustrates a flow diagram for illustrating a method in accordance with one exemplary embodiment. The method in FIG. 5 can be implemented for example by means of the devices discussed with reference to FIGS. 1 to 4, but is not restricted thereto. While the method is described as a sequence of processes or events, the illustrated order should not be interpreted as restrictive, since processes or events can also be implemented in a different order than that illustrated and/or in parallel with one another.

At 50 in FIG. 5 a first parameter partial value is read out from a first memory. At 51 a second parameter partial value is read out from a second memory. The first parameter partial value may be for example an ideal parameter value of a parameter, and the second parameter partial value may be a correction value.

In this case, the first memory can be separate from the second memory. The first memory can have a greater security than the second memory in relation to corrupting events such as cosmic radiation. By way of example, the first memory can be implemented by means of a hardwired logic. The second memory can be implemented for example as an EPROM, flash memory, RAM and/or register.

At 52 a parameter value of a parameter is then formed from the first parameter partial value and the second parameter partial value. By way of example, the first parameter partial value and the second parameter partial value can be added, or the second parameter partial value can be subtracted from the first parameter partial value. In still other examples, the second parameter partial value can also be a multiplicative correction factor for the first parameter partial value, such that the parameter value is formed by multiplication in such an exemplary embodiment.

In some exemplary embodiments, the second parameter partial value has a smaller bit width than the first parameter partial value. Upon corruption of the second parameter partial value, in some exemplary embodiments, an influence can be restricted to the parameter value formed at 52.

At 53 a device is then operated with the parameter value. By way of example, the parameter value can serve for code correction as in the example in FIG. 2 or for predistortion as in the examples in FIGS. 3 and 4, but is not restricted thereto.

Figure 6:
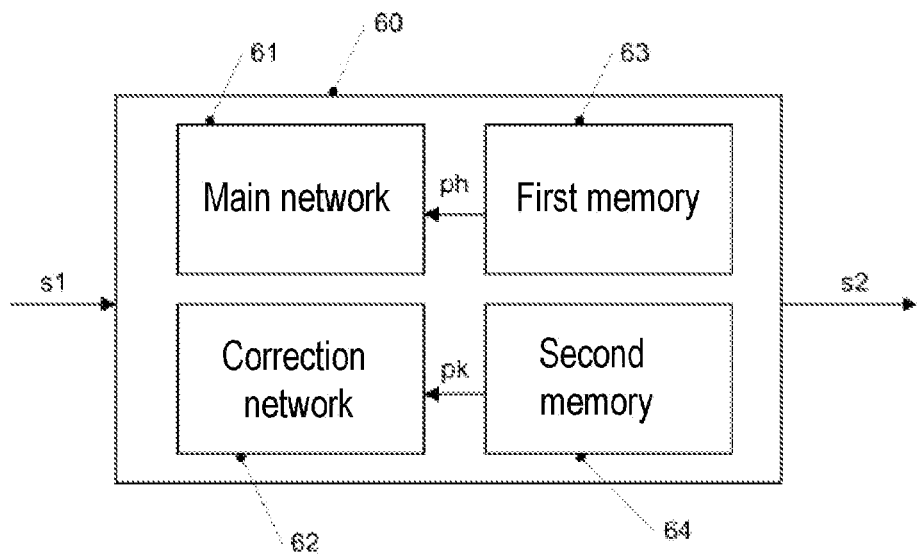
FIG. 6 shows a converter device in accordance with one exemplary embodiment.

A further exemplary embodiment is illustrated in FIG. 6. In this case, FIG. 6 shows a block diagram of a converter device 60 which may be designed as an analog-to-digital converter device or as a digital-to-analog converter device. In the case of an analog-to-digital converter device, the converter device 60 converts an analog signal s1 into a digital signal s2. In the case of a digital-to-analog converter device, the converter device 60 converts a digital signal s1 into an analog signal s2.

The converter device 60 comprises a main network 61 for implementing the converter (analog-to-digital converter or digital-to-analog converter). One or more first parameter values ph for setting or calibrating the main network 61 is or are stored in a first memory 63.

In addition, the converter device 60 comprises a correction network 62, which comprises for example further analog elements for increasing an accuracy or linearity of the main network 61 and which may implement a further converter. The correction network 62 can be set by one or more second parameter values pk stored in a second memory 64.

In this case, the first memory 63 and the second memory 64 can be configured like the first memory 12 and the second memory 13 in FIG. 1, and variations and modifications explained with regard to the first memory 12 and the second memory 13 are also applicable to the first memory 63 and the second memory 64 in a corresponding manner.

In this case, as already mentioned, the main network 61 and the correction network 62 may each comprise a converter circuit (analog-to-digital converter circuit or digital-to-analog converter circuit), wherein a result of a conversion of the main network is then corrected by a result of a conversion of the correction network. Setting on the basis of one or more parameters ph and on the basis of the one or more second parameters pk can then be effected for example as explained with reference to FIGS. 2 and 3. In other words, the main network 61 and the correction network can each comprise code correction circuits or predistortion circuits.

Similar concepts can also be used for an offset or gain correction.

Figure 7:
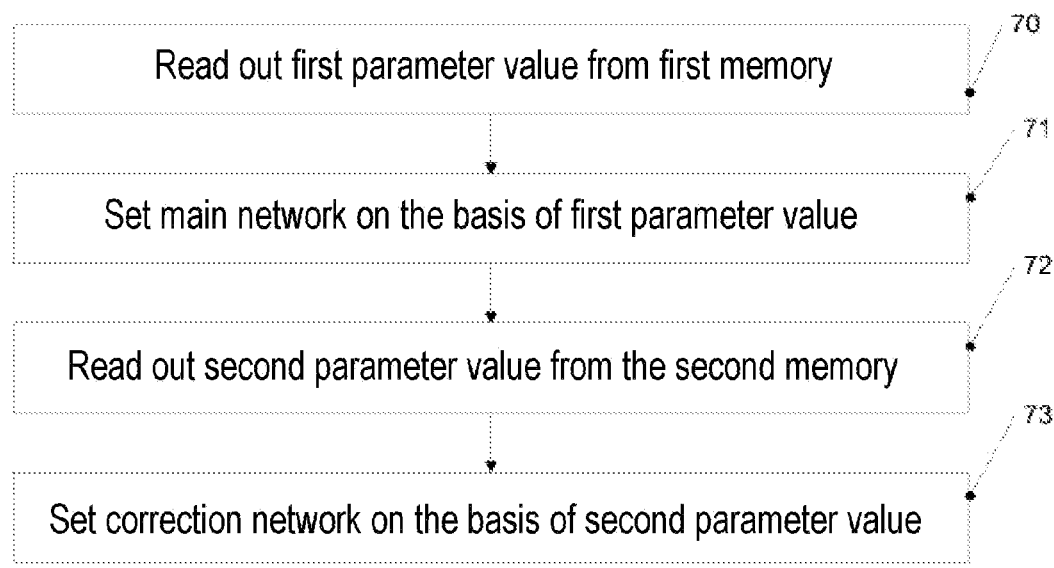
FIG. 7 shows a flow diagram for illustrating a method in accordance with one exemplary embodiment.

FIG. 7 illustrates a flow diagram of a method in accordance with a further exemplary embodiment. The method in FIG. 7 can be implemented for example by means of the device in FIG. 6, but is not restricted thereto. Variations and modifications explained above for the device in FIG. 6 are also applicable to the method in FIG. 7.

The method in FIG. 7 comprises at 70 reading out a first parameter value from a first memory. At 71 the method comprises setting a main network of a converter device such as a digital-to-analog converter device or an analog-to-digital converter device on the basis of the first parameter value. At 72 the method comprises reading out a second parameter value from a second memory. The first memory and the second memory can be configured as already explained with reference to FIG. 1. At 73 a correction network of a converter device is then set on the basis of the second parameter value.

In this case, the various processes explained with reference to FIG. 7 need not necessarily be implemented in the order illustrated. As explained with reference to FIG. 6, the main network and the correction network can comprise analog-to-digital converter circuits and/or digital-to-analog converter circuits.

The exemplary embodiments illustrated above serve merely for illustration and should not be interpreted as restrictive.

The invention claimed is:

1. A converter device for analog-to-digital or digital-to-analog conversion, comprising:
    a first memory for storing a first parameter value,
    a second memory for storing a second parameter value, wherein the first memory is a different memory type that is less sensitive to data corruption than the second memory,
    wherein the converter device is configured to correct a result of the conversion based on the first parameter value alone and based on the first parameter value and the second parameter value.

2. The converter device according to claim 1, wherein the converter device is configured to correct the output based on the first parameter value alone, without the second parameter value, when the second memory or second parameter value is corrupted.

3. The converter device according to claim 1, wherein the first parameter value is represented by a different number of bits than the second parameter value.

4. The converter device according to claim 1, wherein the first memory comprises at least one of a hardwired logic and a read-only memory.

5. The converter device according to claim 1, wherein the second memory comprises an electrically programmable read-only memory, a flash memory, a random excess memory or a register.

6. The converter device according to claim 1, wherein the second memory has a smaller bit width than the first memory.

7. The converter device according to claim 1,
    wherein the first parameter value comprises a first parameter partial value of a parameter,
    wherein the second parameter value comprises a second parameter partial value of the parameter,
    wherein the converter device comprises a combination unit for combining the first parameter partial value with the second parameter partial value to form a parameter value of the parameter.

8. The converter device according to claim 7, wherein the converter device comprises a circuit for converting a first digital value into a second digital value on the basis of the parameter.

9. The converter device according to claim 7, wherein the converter device comprises an analog-to-digital converter, and wherein the circuit comprises a code correction circuit for correcting an output of an analog-to-digital converter.

10. The converter device according to claim 8, wherein the converter device comprises a digital-to-analog converter, and wherein the circuit comprises a predistortion circuit for predistorting a signal to be fed to the digital-to-analog converter.

11. The converter device according to claim 7, wherein the combination unit comprises an adder or a subtractor.

12. The converter device according to claim 7, wherein the first memory and the second memory are configured for storing a look-up table comprising the parameter value of the parameter.

13. The converter device according to claim 1, wherein the converter device comprises a main network and a correction network, wherein the converter device is configured to set the main network on the basis of the first parameter value and the correction network on the basis of the second parameter value.

14. The converter device according to claim 1, wherein the first memory is less susceptible to unintentional data changes due to radiation.

15. The converter device according to claim 1, wherein the first parameter value corresponds to a correction value that is associated with a type of the converter device and the second parameter value corresponds to a correction value specific to the converter device.

16. A method, comprising:
    reading out a first parameter value from a first memory,
    reading out a second parameter value from a second memory that is a different type of memory than the first memory which is less sensitive to data corruption than the second memory, and
    correcting an output of a converter device based on the first parameter value or based on the first parameter value and the second parameter value, wherein the converter device is configured to correct the output based on the first parameter value and based on the first parameter value and the second parameter value.

17. The method according to claim 16, wherein the first parameter value is a first parameter partial value of a parameter, wherein the second parameter value is a second parameter partial value of a parameter, wherein the method further comprises:
    forming a parameter value of a parameter by combining the first parameter partial value and the second parameter partial value, and
    correcting the output converter device on the basis of the parameter value.

18. The method according to claim 17, wherein the first parameter partial value corresponds to an ideal parameter value and the second parameter partial value corresponds to a correction value.

19. The method according to claim 17, wherein correcting comprises a predistortion of an input value of a digital-to-analog converter on the basis of the parameter value.

20. The method according to claim 16, wherein correcting comprises setting a main network of the converter device on the basis of the first parameter value and setting a correction network of the converter device on the basis of the second parameter value.

* * * * *